(12) United States Patent
Ishikawa et al.

(10) Patent No.: US 12,271,109 B2
(45) Date of Patent: Apr. 8, 2025

(54) PELLICLE DEMOUNTING METHOD, AND PELLICLE DEMOUNTING DEVICE

(71) Applicant: MITSUI CHEMICALS, INC., Tokyo (JP)

(72) Inventors: Akira Ishikawa, Ichihara (JP); Kazuo Kohmura, Chiba (JP)

(73) Assignee: MITSUI CHEMICALS, INC., Tokyo (JP)

( * ) Notice: Subject to any disclaimer, the term of this patent is extended or adjusted under 35 U.S.C. 154(b) by 564 days.

(21) Appl. No.: 17/770,163

(22) PCT Filed: Dec. 10, 2020

(86) PCT No.: PCT/JP2020/046072
§ 371 (c)(1),
(2) Date: Apr. 19, 2022

(87) PCT Pub. No.: WO2021/117817
PCT Pub. Date: Jun. 17, 2021

(65) Prior Publication Data
US 2022/0390829 A1    Dec. 8, 2022

(30) Foreign Application Priority Data

Dec. 13, 2019  (JP) ................. 2019-225700

(51) Int. Cl.
*G03F 7/00* (2006.01)
*G03F 1/24* (2012.01)
*G03F 1/64* (2012.01)

(52) U.S. Cl.
CPC ............. *G03F 1/64* (2013.01); *G03F 1/24* (2013.01); *G03F 7/70733* (2013.01); *G03F 7/7075* (2013.01)

(58) Field of Classification Search
CPC ..... G03F 1/24; G03F 1/62; G03F 1/64; G03F 1/82; G03F 7/70733; G03F 7/7075
See application file for complete search history.

(56) References Cited

U.S. PATENT DOCUMENTS

2019/0094683 A1*   3/2019   Yoo ................... G03F 1/82

FOREIGN PATENT DOCUMENTS

JP      2016206527 A    12/2016

* cited by examiner

*Primary Examiner* — Peter B Kim
(74) *Attorney, Agent, or Firm* — BUCHANAN INGERSOLL & ROONEY PC

(57) ABSTRACT

The disclosure addresses provision of a pellicle demounting method having excellent property with respect to reduction of contamination of a photomask. A method of demounting a pellicle, the method is provided which includes: providing a stack including a photomask, a pellicle frame, and a pellicle film that are arranged in this order; providing an electrode; and a demounting step including disposing the stack and the electrode such that the pellicle film in the stack and the electrode face each other, and applying a voltage to the electrode to generate an electrostatic attractive force, which attracts the pellicle film in a direction toward the electrode, thereby demounting the pellicle film from the photomask in the stack.

12 Claims, 11 Drawing Sheets

PELLICLE DEMOUNTING METHOD, AND PELLICLE DEMOUNTING DEVICE

TECHNICAL FIELD

The present invention relates to a pellicle demounting method and a pellicle demounting device.

BACKGROUND ART

Increase in the degree of integration of semiconductor devices and downsizing of semiconductor devices have been accelerating year by year. For example, patterns having a line width of about 45 nm are formed by light exposure using excimer at present, but it has recently been requested to form patterns having a line width of 32 nm or less due to further downsizing of semiconductor devices. Such fine processing is difficult to perform using conventional light exposure using excimer. In view of this situation, studies have been made with respect to replacement of the exposure light by extreme ultra violet (EUV) light having a shorter wavelength.

EUV light has a property such that EUV light is easily absorbed by any substances. In photolithography using EUV light as a light for exposure (hereinafter also referred to as "EUV lithography"), exposure to light is performed using a reflective optical system. Specifically, EUV light is reflected by a photomask (for example, a reticle or the like) on which an exposure pattern is reflected, and a resist is exposed to the EUV light as the reflected light.

In the photolithography step, when contaminants attach to the photomask, the EUV light may be absorbed by the contaminants and scattered thereby, and exposure to the light does not occur in the desired pattern in some cases. In consideration of this, a pellicle is mounted on (i.e., attached to) a side of the photomask that is to be irradiated with EUV light, thereby protecting the photomask.

The configuration of the pellicle includes a pellicle film for protecting a face of the photomask that is to be irradiated with EUV light, and a pellicle frame that supports the pellicle film.

A pellicle mounted on a photomask may experience contamination with dust or the like, deterioration by light, and the like. In these cases, the necessity to replace the pellicle may arise, and, for this purpose, the necessity to demount (i.e., detach) the pellicle mounted on a photomask may arise.

The pellicle demounting method described in Patent Document 1, for example, is known as a conventional method for demounting a pellicle from a photomask. In Patent Document 1, a pellicle demounting method is disclosed in which at least a pellicle film of a pellicle disposed on a photomask is allowed to tightly contact with a sheet, and in which the pellicle is demounted from the photomask.
Patent Document 1: Japanese Patent Application Laid-open (JP-A) No. 2016-206527

SUMMARY OF INVENTION

Problem to be Solved by Invention

A problem to be solved by an embodiment of the present disclosure is to provide a pellicle demounting method having excellent property with respect to reduction of contamination of a photomask.

Means for Solving the Problem

Means for solving the foregoing problem include the following aspects.

<1> A pellicle demounting method, including:
a step of providing a stack including a photomask, a pellicle frame, and a pellicle film that are arranged in this order;
a step of providing an electrode; and
a demounting step including disposing the stack and the electrode such that the pellicle film in the stack and the electrode face each other, and applying a voltage to the electrode to generate an electrostatic attractive force, which attracts the pellicle film in a direction toward the electrode, thereby demounting the pellicle film from the photomask in the stack.

<2> The pellicle demounting method according to <1>, wherein, in the demounting step, a film is disposed between the pellicle film in the stack and the electrode, and the pellicle film is demounted by being attracted to a surface of the film by the electrostatic attractive force.

<3> The pellicle demounting method according to <1> or <2>, wherein the stack further includes a mask adhesion layer between the photomask and the pellicle frame.

<4> The pellicle demounting method according to <3>, wherein, when the stack is designated as a first stack, the demounting step includes:
demounting the pellicle film by means of the electrostatic attractive force while leaving the pellicle frame at the photomask-side part of the first stack, to obtain a second stack that includes the photomask, the mask adhesion layer, and the pellicle frame;
heat-treating the second stack; and
demounting the pellicle frame from the photomask in the second stack.

<5> The pellicle demounting method according to any one of <1> to <4>, further including a step of heat-treating the stack prior to the demounting step.

<6> The pellicle demounting method according to any one of <1> to <5>, wherein at least one of a recess portion or a cutout is provided at an outer peripheral face of the pellicle frame.

<7> A pellicle demounting device for implementing the demounting step of the pellicle demounting method of any one of <1> to <6>, the device including:
a retainer member configured to retain the stack; and
the electrode.

<8> The pellicle demounting device according to <7>, wherein the retainer member is configured to retain the stack in an orientation such that the photomask is located at the upper side and the pellicle film is located at the lower side, and the retainer member has an opening configured to expose a self-standing portion of the pellicle film.

<9> The pellicle demounting device according to <8>, wherein the retainer member and the electrode are disposed such that the opening and the electrode face each other, or wherein at least one of the retainer member or the electrode is movable to attain an arrangement in which the opening and the electrode face each other.

<10> The pellicle demounting device according to <9>, wherein the electrode has an area that is larger than that of the opening.

<11> The pellicle demounting device according to <9> or <10>, further including a film transfer means running a resin film across a region between the opening and the electrode facing each other.

<12> The pellicle demounting device according to any one of <7> to <11>, wherein the retainer member includes a pellicle frame fixing member configured to fix the pellicle frame.

Advantageous Effect of Invention

According to the present disclosure, a pellicle demounting method having excellent property with respect to reduction of contamination of a photomask is provided.

MODES FOR CARRYING OUT THE INVENTION

Figure 1:
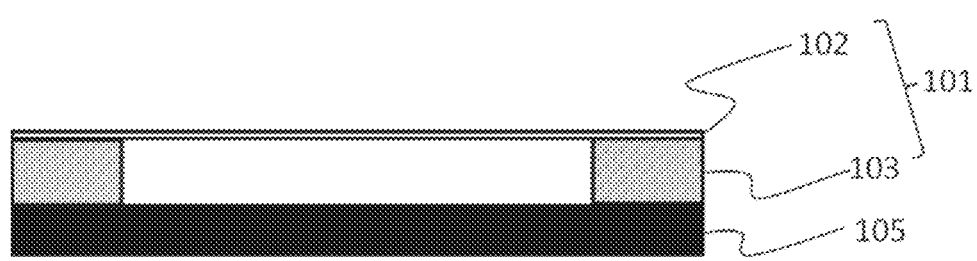
FIG. 1 is a schematic cross-sectional view schematically illustrating one example of a stack that is provided in a step of providing a stack in a pellicle demounting method according to the present disclosure.

In the present specification, any numerical range expressed using "to" means a range including numerical values described before and after "to" as a minimum value and a maximum value, or as a lower limit value and an upper limit value. For numerical value ranges described in a stepwise manner in the present specification, the upper limit value or the lower limit value of one numerical value range may be replaced with the upper limit value or the lower limit value of another numerical value range in the stepwise description. The upper limit value or the lower limit value of any numerical value range described in the present specification may also be replaced with a value described in Examples.

In the present specification, a combination of preferable aspects constitutes a more preferable aspect.

In the present specification, the term "step" encompasses not only an independent step, but also encompasses a step that cannot be clearly distinguished from other steps, as long as the intended purpose of the step is achieved.

In the present disclosure, extreme ultraviolet (EUV) light refers to a light having a wavelength of from 5 nm to 30 nm. The wavelength of the EUV light is preferably a wavelength of from 5 nm to 13.5 nm.

In the present disclosure, EUV light and lights having shorter wavelengths than EUV light are sometimes collectively referred to as "EUV light and the like".

In the present specification, the term "pellicle" refers to a structure that includes a pellicle frame and a pellicle film supported on one thickness-direction end face of the pellicle frame.

In the present specification, the term "pellicle demounting method" refers to a method of demounting (i.e., detaching) at least a pellicle film from a photomask on which the pellicle has been mounted.

The scope of the pellicle demounting method encompasses both of:
 a method of demounting the pellicle film while leaving the pellicle frame on the photomask on which the pellicle has been mounted; and
 a method of demounting both of the pellicle film and the pellicle frame (i.e., the entire pellicle) from the photomask on which the pellicle has been mounted.

The scope of the pellicle demounting method encompasses a method of demounting (i) only the pellicle film or both of the pellicle film and the pellicle frame, and (ii) another element (for example, an adhesive layer or the like).

The scope of the pellicle demounting method encompasses a method of detaching the pellicle from the photomask while destroying the pellicle.

[Pellicle Demounting Method]

A pellicle demounting method according to the present disclosure includes:
 a step of providing a stack including a photomask, a pellicle frame, and a pellicle film that are arranged in this order;
 a step of providing an electrode; and
 a demounting step including disposing the stack and the electrode such that the pellicle film in the stack and the electrode face each other, and applying a voltage to the electrode to generate an electrostatic attractive force, which attracts the pellicle film in a direction toward the electrode, thereby demounting the pellicle film from the photomask in the stack.

The pellicle demounting method according to the present disclosure has an excellent property with respect to reduction of contamination of a photomask. In other words, contamination of a photomask is reduced when the pellicle demounting method according to the present disclosure is used. We surmise that the reason why this effect is exerted is as follows.

A pellicle film is a film having an extremely small thickness. For example, pellicle films used in EUV lithography have thicknesses on the order of nanometers. Therefore, breakage including the concept of destruction the same shall apply hereinafter) of a pellicle film is likely to occur when the pellicle is demounted from a photomask, and, in some cases, the photomask is contaminated by attachment of pellicle film pieces, generated by breakage of the pellicle film, to the photomask. In particular, the self-standing portion of the pellicle film (i.e., a portion that is positioned above the opening area defined by the inner peripheral face of the pellicle frame and that is not supported by the pellicle frame) is likely to break.

In order to address the foregoing problem, in the pellicle demounting method according to the present disclosure, demounting of a pellicle film from a photomask in a stack that includes the photomask, the pellicle frame, and the pellicle film arranged in this order is performed as follows.

The stack and the electrode are disposed such that the pellicle film in the stack and the electrode face each other, and a voltage is applied to the electrode to generate an electrostatic attractive force. By allowing the pellicle film to be attracted in a direction toward the electrode based on the electrostatic attractive force, the pellicle film is demounted from the photomask in the stack. In this process, it is acceptable for the pellicle film to be broken during demounting of the pellicle film. When the pellicle film is broken, pellicle film pieces generated by the breakage are attracted in a direction toward the electrode.

As explained above, even when the pellicle film is broken in the pellicle demounting method according to the present disclosure, pellicle film pieces generated by the breakage of the pellicle film are attracted in a direction toward the electrode, whereby attachment of the pellicle film pieces to the photomask (i.e., photomask contamination due to pellicle film pieces) is reduced.

In the present disclosure, the expression "the pellicle film in the stack and the electrode face each other" refers to a state in which the electrode is disposed so as to be closer to the pellicle film side of the stack (than the photomask side). As far as this condition is satisfied, one or more other elements (for example, a member (such as a resin member) other than the electrode in the after-mentioned electrostatic chuck, the after-mentioned film, or the like) may be present between the pellicle film and the electrode.

An example according to the present disclosure is described by referring to drawings, as appropriate. However, the present disclosure is not limited to specific examples such as the following figures.

An element that is common to multiple figures is assigned the same reference character, and overlapping explanations thereof are omitted in some cases. Further, in the figures, a part of a hidden line is omitted in some cases in order to increase the visibility of the structure.

FIG. 1 is a schematic cross-sectional view schematically illustrating one example of a stack that is provided in the step of providing a stack in the pellicle demounting method according to the present disclosure.

As illustrated in FIG. 1, the stack according to the present example includes a photomask 105, a pellicle frame 103, and a pellicle film 102, which are arranged in this order. The stack according to the present example can be obtained, for example, by mounting, on a photomask 105, a pellicle 101 that includes the pellicle film 102 and the pellicle frame 103.

The pellicle frame 103 supports the pellicle film 102 at one thickness-direction end face side of the pellicle frame 103. In other words, a part of the pellicle 102 that overlaps the pellicle frame 103 in a plan view is supported by the pellicle frame 103. A part of the pellicle film 102 that overlaps the opening area defined by the inner peripheral face of the pellicle frame 103 in a plan view is not supported, and is a self-standing portion (i.e., the film is present by itself rather than being formed on an underlying base).

Figure 2:
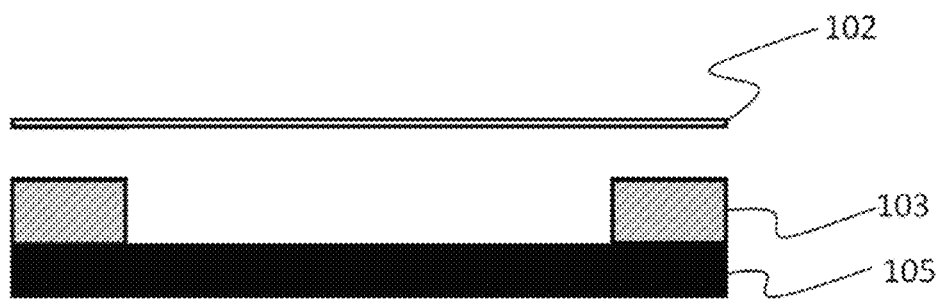
FIG. 2 is a schematic cross-sectional view schematically illustrating one example of pellicle demounting in the present disclosure.

FIG. 2 is a schematic cross-sectional view schematically illustrating one example of pellicle demounting according to the present disclosure.

As illustrated in FIG. 2, in the pellicle demounting according to the present example, the pellicle film 102 is demounted while leaving the pellicle frame 103 on the photomask 105 of the stack shown in FIG. 1. Remounting is performed by attracting the pellicle film 102, by an electrostatic attractive force, in a direction toward the electrode (not shown) disposed to face the pellicle film 102 (for example, upward in FIG. 2).

Although the demounted pellicle film 102 maintains the film shape in the present example, it is acceptable for the pellicle film 102 to be broken during demounting.

Figure 3:
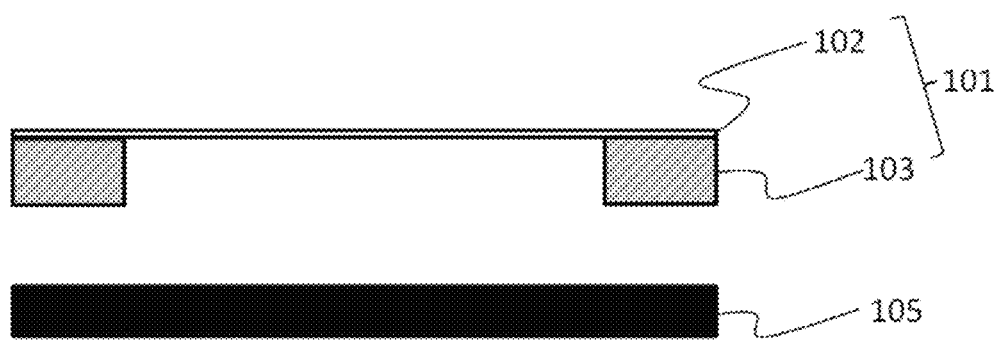
FIG. 3 is a schematic cross-sectional view schematically illustrating another example of pellicle demounting in the present disclosure.

FIG. 3 is a schematic cross-sectional view schematically illustrating another example of pellicle demounting in the present disclosure.

In the pellicle demounting according to this example, both of the pellicle film 102 and the pellicle frame 103 (i.e., the entire pellicle 101) are demounted from the photomask 105 in the stack shown in FIG. 1, as illustrated in FIG. 3. The demounting is performed by allowing the pellicle 101 to be attracted, by an electrostatic attractive force, in a direction toward the electrode (not shown) disposed to face the pellicle film 102.

Also in the present example, the pellicle film 102 in the demounted pellicle 101 maintains the film shape. However, it is acceptable for the pellicle film 102 to be broken during demounting.

Individual steps that may be included in the pellicle demounting method according to the present disclosure are described in more detail below.

<Step of Providing Stack>

The pellicle demounting method according to the present disclosure includes a step of providing a stack. The stack as used herein is a stack that includes a photomask, a pellicle frame, and a pellicle film that are arranged in this order (see, for example, FIG. 1 discussed above). The step of providing a stack may be a step of producing a stack, or a step of simply providing a stack that has been produced in advance.

(Pellicle Film)

The stack provided in the present step includes a pellicle film. Known pellicle films may be used as the pellicle film. The material contained in the pellicle film is not particularly limited, and may be any of an organic material, an inorganic material, or a mixed material of an organic material and an inorganic material.

The organic material is, for example, a fluorine-containing polymer or the like. Example of the inorganic material include crystalline silicon (for example, monocrystalline silicon, polycrystalline silicon, or the like), diamond-like carbon (DLC), graphite, amorphous carbon, graphene, silicon carbide, silicon nitride, aluminum nitride, and the like.

The pellicle film may include any one of the above materials singly, or two or more of the above materials.

The configuration of the pellicle film may be a monolayer configuration or a configuration formed of two or more layers.

The thickness of the pellicle film (total thickness when the pellicle film is formed of two or more layers) is preferably from 2 nm to 200 nm, more preferably from 2 nm to 100 nm, still more preferably from 2 nm to 70 nm, and particularly preferably from 2 nm to 50 nm. The lower limit of the thickness of the pellicle film may be 5 nm or 10 nm.

With respect to the configuration of the pellicle film, known pellicle film configurations, such as those disclosed in, for example, Japanese Patent Application Laid-open (JP-A) No. 2014-021217 and International Publication (WO) No. 2015/174412, may be referenced, if necessary.
(Pellicle Frame)

The stack provided in the present step includes a pellicle frame. Known pellicle frames that are members having a frame shape may be used as the pellicle frame. The material of the pellicle frame may be an ordinary material used for pellicle frames.

Examples of the material of the pellicle frame include, specifically, aluminum, aluminum alloys (5000 series, 6000 series, 7000 series, and the like), stainless steel, silicon, silicon alloys, iron, iron-based alloys, carbon steel, tool steel, ceramics, metal-ceramic composite materials, resins, and the like. Among them, aluminum and aluminum alloys are more preferable from the viewpoints of light weight and rigidity.

The pellicle frame may have a protective film on a surface thereof. The protective film is preferably a protective film that has resistance to hydrogen radicals present in the light exposure atmosphere and to EUV light.

An example of the protective film is an oxide coating film. The oxide coating film can be formed using known methods such as anode oxidization. The oxide coating film may be colored with a black dye. When the pellicle frame has an oxide coating film colored with a black dye, detection of contaminants on the pellicle frame is easier.

With respect to the configuration of the pellicle frame, known pellicle frame configurations, such as those disclosed in, for example, Japanese Patent Application Laid-open (JP-A) Nos. 2014-021217 and 2010-146027, may be referenced, as appropriate.

The outer peripheral face of the pellicle frame is preferably provided with at least one of a recess portion or a cutout. This configuration makes it easy to demount the pellicle frame from the photomask, in the step of demounting the pellicle frame after the pellicle film is demounted from the photomask by an electrostatic attractive force. For example, the pellicle frame can easily be demounted from the photomask by inserting a grip tool for pellicle frame handling into the recess portion or the cutout, or by allowing the grip tool to catch the pellicle frame at the recess portion or the cutout.

The number of recess portions or cutouts in the outer peripheral face of the pellicle frame may be one, or two or more. When plural recess portions are provided, the shapes of the respective recess portions may be the same as each other or different from each other (and the same applies to the case of cutouts).

Figure 5A:
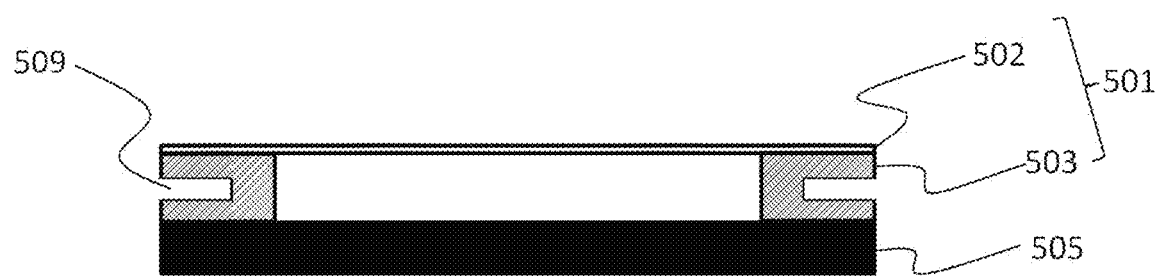
FIG. 5A is a schematic cross-sectional view illustrating one example of a stack that includes a pellicle frame according to an aspect in which a recess portion is provided on the outer peripheral face of the pellicle frame.

FIG. 5A is a schematic cross-sectional view illustrating one example of a stack that includes a pellicle frame according to an aspect in which a recess portion is provided on an outer peripheral face.

As illustrated in FIG. 5A, a stack according to this example includes a photomask 505, and a pellicle 501 that includes a pellicle frame 503 and a pellicle film 502. In this stack, the photomask 505, the pellicle frame 503, and the pellicle film 502 are disposed in this order.

In the outer peripheral face of the pellicle frame 503, a recess portion 509 is provided. Each recess portion 509 extends in parallel to the pellicle film 502 face, starting from the outer peripheral face of the pellicle frame.

In the stack in the present example, for example, the pellicle frame 503 can easily be demounted from the photomask 505 by inserting a grip tool for pellicle frame handling into the recess portion 509, or by allowing the grip tool to catch the pellicle frame at the recess portion 509, in the step of demounting the pellicle frame 503 after the pellicle film 502 is demounted from the photomask 505 by an electrostatic attractive force.

Figure 5B:
FIG. 5B is a schematic cross-sectional view illustrating one example of a stack that includes a pellicle frame according to an aspect in which a cutout is provided at the outer peripheral face of the pellicle frame.

FIG. 5B is a variant modified from the stack shown in FIG. 5A, and is a schematic cross-sectional view illustrating one example of a stack that includes a pellicle frame according to an aspect in which a cutout is provided at an outer peripheral face.

The structure of the stack shown in FIG. 5B is the same as the structure of the stack shown in FIG. 5A, except that the recess portion 509 is replaced by a cutout 510.

In the stack according to this example, the pellicle frame 503 can easily be demounted from the photomask 505, for example, by inserting a grip tool for pellicle frame handling into the cutout 510, or by allowing the grip tool to catch the pellicle frame at the cutout 510.

Further, a through hole penetrating through the pellicle frame from the outer peripheral face thereof to the inner peripheral face thereof may be provided in the pellicle frame. This through hole functions as an air vent that allows gas communication between the exterior of the stack and the interior of the stack (i.e., the space enclosed by the inner peripheral face of the pellicle frame, the pellicle film, and the photomask).

For example, in the after-mentioned demounting step, the pellicle film can be demounted by: applying a voltage to the electrode to generate an electrostatic attractive force and allowing the interior of the stack to have a positive pressure by feeding air into the interior of the stack through the air vent provided in the pellicle frame, so as to expand the pellicle film toward the outer side (i.e., in a direction toward the electrode) and break the pellicle film; and attracting the pellicle film pieces generated by the breakage toward the electrode.

The pellicle frame may be provided with a hole of which the depth direction is the pellicle frame thickness direction (hereinafter also referred to as a "pellicle frame thickness direction hole"). The provision of the pellicle frame thickness direction hole makes it easy to demount the pellicle frame in the step of demounting the pellicle frame after the pellicle film is demounted from the photomask by an electrostatic attractive force. For example, the pellicle frame can easily be demounted from the photomask by inserting a grip tool for pellicle frame handling into the pellicle frame thickness direction hole, or by allowing the grip tool to catch the pellicle frame at the pellicle frame thickness direction hole.

A hole of which the depth direction is the thickness direction of the pellicle film and the pellicle frame may be provided in the pellicle film and the pellicle frame in the stack, from the viewpoint of the aforementioned ease of demounting the pellicle frame.

Figure 4:
FIG. 4 is a schematic cross-sectional view illustrating one example of a stack in which a hole is formed in a pellicle film and a pellicle frame such that the depth direction of the hole is the thickness direction of the pellicle film and the pellicle frame.

FIG. 4 is a schematic cross-sectional view illustrating one example of a stack according to an aspect wherein a hole of which the depth direction is the thickness direction of the pellicle film and the pellicle frame is provided in the pellicle film and the pellicle frame.

As illustrated in FIG. 4, the stack according to this example includes a photomask 405, and a pellicle 401 that includes a pellicle frame 403 and a pellicle film 402.

In the pellicle film 402 and the pellicle frame 403 in the stack, holes 409 of which the depth direction is the thickness direction of the pellicle film 402 and the pellicle frame 403 is provided.

The number of the recess portions or cutouts provided at the outer peripheral face of the pellicle frame, the number of the holes of which the depth direction is the pellicle frame thickness direction, and the number of the holes of which the depth direction is the thickness direction of the pellicle film and the pellicle frame (which are hereinafter also collectively referred to as "spaces") may each individually be one, or two or more. The shapes or sizes of these spaces may differ space by space.

(Pellicle Film Adhesion Layer)

The stack provided in the present step may further include a pellicle film adhesion layer disposed between the pellicle film and the pellicle frame.

The stack according to this aspect can be produced, for example, by mounting a pellicle that includes the pellicle film, the pellicle film adhesion layer, and the pellicle frame on a photomask.

The term "pellicle film adhesion layer" refers to a layer that is disposed between the pellicle film and the pellicle frame and that is configured to adhere the pellicle film and the pellicle frame.

The pellicle film adhesion layer may include a known adhesive. Examples of an adhesive that can be contained in the pellicle film adhesion layer include acrylic resin adhesives, epoxy resin adhesives, silicone resin adhesives, fluorine-containing silicone-based adhesives, fluorine-containing ether-based adhesives, and the like.

(Photomask)

The stack provided in the present step includes a photomask. The photomask is not particularly limited as long as the photomask has a light irradiation face to be irradiated with light.

The photomask to be used may be a photomask that includes, for example, a support substrate, a reflective layer disposed on the support substrate, and an absorber layer formed on the reflective layer.

In the photomask, a face at a side at which the reflective layer and the absorber layer are provided serves as a light irradiation face. When the light irradiation face is irradiated with light such as EUV light, the absorber layer at the light irradiation face absorbs at least a part of the irradiated light, and the remainder of the light is reflected by the reflective layer. The reflected light is irradiated on a sensitive substrate (for example, a semiconductor substrate provided with a photoresist film). As a result, a desired image is formed on the sensitive substrate.

A preferable example of the reflective layer is a multilayer film of molybdenum (Mo) and silicon (Si). The absorber layer is preferably formed of a material having high absorbance with respect to the EUV light and the like, such as chromium (Cr) or tantalum nitride.

(Mask Adhesion Layer)

The stack provided in the present step may further include a mask adhesion layer disposed between the photomask and the pellicle frame.

The stack according to this aspect can be produced, for example, by mounting, on a photomask, a pellicle including the pellicle film, the pellicle frame, and the mask adhesion layer that are arranged in this order, in an orientation such that the mask adhesion layer and the photomask contact each other.

The term "mask adhesion layer" refers to a layer that is disposed between the photomask and the pellicle frame and that is configured to adhere the photomask and the pellicle frame.

The mask adhesion layer may include a known adhesive. Examples of an adhesive that can be contained in the mask adhesion layer include double-sided pressure-sensitive adhesive tapes, silicone resin-based adhesives, acrylic adhesives, rubber-based adhesives, vinyl-based adhesives, epoxy-based adhesives, and the like.

The stack provided in the present step may include both of the mask adhesion layer and the pellicle film adhesion layer.

Figure 6:
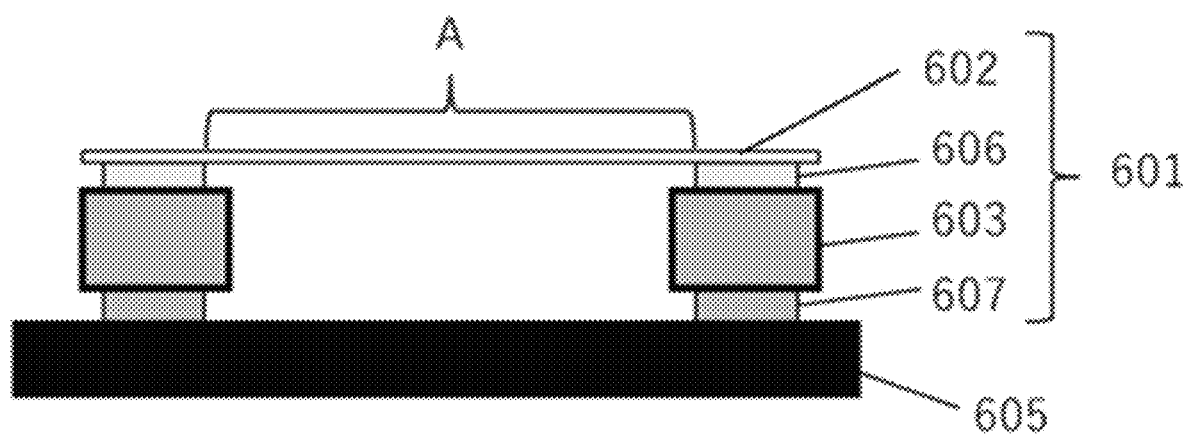
FIG. 6 is a schematic cross-sectional view schematically illustrating another example of a stack that is provided in a step of providing a stack in a pellicle demounting method according to the present disclosure.

FIG. 6 is a schematic cross-sectional view schematically illustrating another example (specifically, an example other than the example illustrated in FIG. 1) of the stack that is provided in the step of providing a stack in the pellicle demounting method according to the present disclosure.

As illustrated in FIG. 6, the stack according to this example includes a photomask 605, a mask adhesion layer 607, a pellicle frame 603, a pellicle film adhesion layer 606, and a pellicle film 602 that are arranged in this order. The stack according to the present example can be produced using, for example, a pellicle 601 including the mask adhesion layer 607, the pellicle frame 603, the pellicle film adhesion layer 606, and the pellicle film 602 that are arranged in this order.

Figure 7:
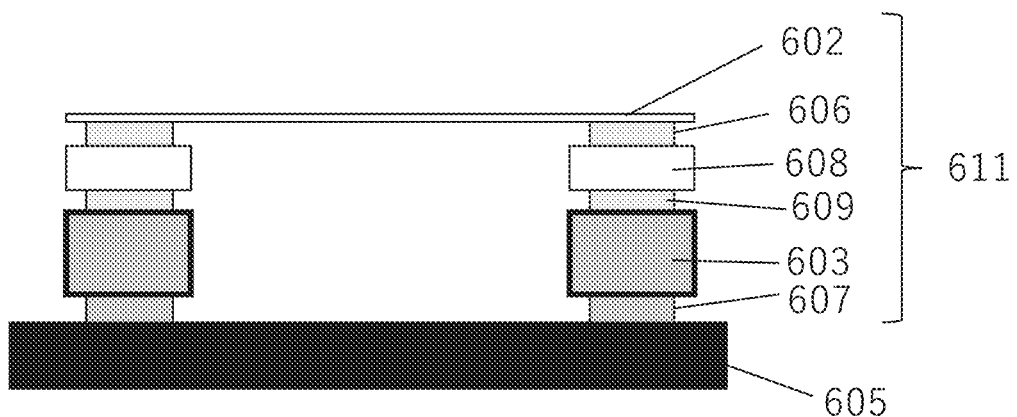
FIG. 7 is a schematic cross-sectional view schematically illustrating still another example of a stack that is provided in a step of providing a stack in a pellicle demounting method according to the present disclosure.

FIG. 7 is a schematic cross-sectional view schematically illustrating still another example of the stack that is provided in the step of providing a stack in the pellicle demounting method according to the present disclosure.

The stack according to the example illustrated in FIG. 7 has the same configuration as that of the stack according to the example illustrated in FIG. 6, except that a pellicle film support frame 608 and a support frame adhesion layer 609 are disposed between the pellicle film adhesion layer 606 and the pellicle frame 603 in FIG. 7 (here, the pellicle film support frame 608 contacts the pellicle film adhesion layer 606, and the support frame adhesion layer 609 contacts the pellicle frame 603).

The stack in the present example can be provided using, for example, a pellicle 611 including the mask adhesion layer 607, the pellicle frame 603, the support frame adhesion layer 609, the pellicle film support frame 608, the pellicle film adhesion layer 606, and the pellicle film 602 that are arranged in this order.

Figure 8:
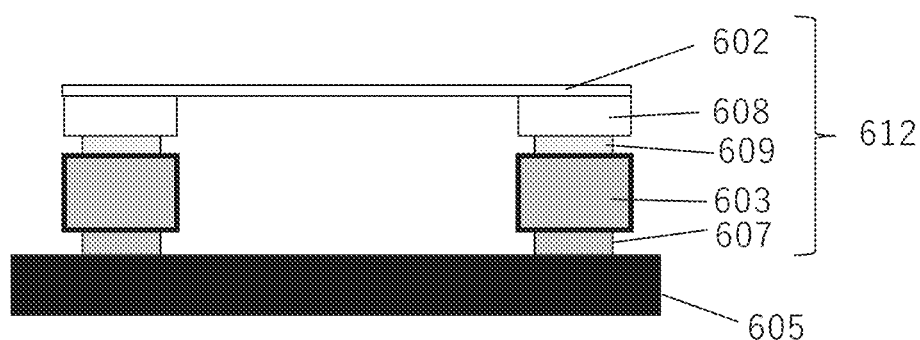
FIG. 8 is a schematic cross-sectional view schematically illustrating still another example of a stack that is provided in a step of providing a stack in a pellicle demounting method according to the present disclosure.

FIG. 8 is a schematic cross-sectional view schematically illustrating still another example of the stack that is provided in the step of providing a stack in the pellicle demounting method according to the present disclosure.

The configuration of the stack according to the example illustrated in FIG. 8 is the same as that of the stack according to the example illustrated in FIG. 7, except that the pellicle film adhesion layer 606 is not present in FIG. 8.

The stack in the present example can be produced using, for example, a pellicle 612 that includes the mask adhesion layer 607, the pellicle frame 603, the support frame adhesion layer 609, the pellicle film support frame 608, and the pellicle film 602 that are arranged in this order.

As illustrated in FIGS. 6 to 8, the scope of the pellicle according to the present disclosure encompasses not only an aspect (see FIG. 1) in which a pellicle film is directly supported at one thickness-direction end face side of a pellicle frame (i.e., without another element disposed therebetween), but also aspects (see FIGS. 6 to 8) in which a pellicle film is supported at one thickness-direction end face side of a pellicle frame with one or more other elements (for example, a pellicle film adhesion layer, a pellicle film support frame, a support frame adhesion layer, or the like) disposed therebetween.

<Step of Providing Electrode>

The pellicle demounting method according to the present disclosure includes a step of providing an electrode. The electrode is an element used for demounting a pellicle film in the after-mentioned demounting step.

The step of providing an electrode may be a step of producing an electrode, or a step of simply providing an electrode that has been produced in advance.

The electrode is not limited in terms of the size, shape, and number thereof, and the size, shape, and number may be set, as appropriate. The size of the electrode is preferably larger than that of the self-standing portion of the pellicle film (for example, area A in FIG. 6) from the viewpoint of the capability to collect the pellicle film.

The step of providing an electrode may be a step of providing a unit that includes the electrode (for example, an electrostatic chuck). In this case, a voltage is applied to the electrode in the electrode-including unit in the after-mentioned demounting step, and demounting of the pellicle film is carried out utilizing an electrostatic attractive force generated.

The material of a part of the electrode-including unit other than the electrode is not particularly limited, and examples thereof include glass, ceramics, and resins, which have electrically insulating properties. The structure of the electrode in the electrode-including unit is not particularly limited, and may be a monopolar structure or a bipolar structure.

The electrostatic chuck, which is one example of the electrode-including unit, may be a Coulomb force electrostatic chuck or a Johnson-Rahbek force (J-R style) electrostatic chuck.

The Coulomb force electrostatic chuck is an electrostatic chuck having a configuration wherein the material disposed between the electrode and the target material to which an electrostatic attractive force is to be applied is an electrically insulating material, and the J-R style electrostatic chuck is an electrostatic chuck having a configuration wherein the material disposed between the electrode and the target material to which an electrostatic attractive force is to be applied is an electrically conductive ceramic compound.

The Coulomb force electrostatic chuck is not particularly limited, and examples thereof include: a Coulomb force electrostatic chuck having a polyimide sheet as an insulating polymer material adhered to a metal plate by an adhesive, as described in Japanese Patent Application (JP-A) No. S53-77489; a Coulomb force electrostatic chuck having an electrode between two insulating ceramic plates, as described in Japanese Patent Application (JP-A) No. S63-95644, H4-206545, and H5-36819; and a Coulomb force electrostatic chuck having, on an insulating ceramic plate, an electrode that has been covered with an insulating ceramic by a thermal spraying method, as described in Japanese Patent Application (JP-A) No. S59-152636.

In J-R style electrostatic chucks, the volume resistivity of the conductive ceramic disposed between the electrode and the target material is an important factor.

The J-R style electrostatic chuck is not particularly limited, and examples thereof include: a J-R style electrostatic chuck using a conductive ceramic composed of aluminum nitride, TiN, and Ce, as described in Japanese Patent Application (JP-A) No. 2000-143349; a J-R style electrostatic chuck using a conductive ceramic composed of aluminum oxide and titanium oxide, as described in Japanese Patent Application (JP-A) No. 2006-049356; a J-R style electrostatic chuck using a conductive ceramic having at least one of titanium carbide, titanium nitride, tungsten carbide, tantalum carbide, molybdenum carbide, niobium carbide, or vanadium carbide dispersed in an insulating ceramic composed of alumina, zirconia, silicon nitride, and aluminum nitride, as described in Japanese Patent Application (JP-A) No. 2008-087988.

Among them, the electrostatic chuck is preferably a Coulomb force electrostatic chuck, from the viewpoint of the capability to reduce photomask contamination.

<Demounting Step>

The pellicle demounting method according to the present disclosure includes a demounting step of demounting the pellicle film from the photomask in the aforementioned stack.

The demounting in the present step is carried out by disposing the stack and the electrode such that the pellicle film in the stack and the electrode face each other, and applying a voltage to the electrode to generate an electrostatic attractive force, thereby attracting the pellicle film in a direction toward the electrode based on the generated electrostatic attractive force. The pellicle film is collected as a result of the demounting.

It is acceptable for the pellicle film to be broken during this process. In a case in which the pellicle film is broken, pellicle film pieces are attracted in a direction toward the electrode and thereby collected.

The electrostatic attractive force generated by applying a voltage to the electrode is preferably 9.8 mN/cm$^2$ (i.e., 1 gf/cm$^2$) or more, and more preferably 49 mN/cm$^2$ (i.e., 5 gf/cm$^2$) or more, from the viewpoint of the capability to collect the pellicle film.

During the demounting of the pellicle film by an electrostatic attractive force in the present step, one or more other elements (for example, a member in the electrostatic chuck described above other than the electrode (for example, a resin member), the after-mentioned film, or the like) may be present or not present between the pellicle film and the electrode.

When other elements are not present between the pellicle film and the electrode, the pellicle film (including the case of being present in the form of pellicle film pieces; the same applies hereinafter) attracted in a direction toward the electrode is adsorbed on a surface of the electrode and collected.

When another element is present between the pellicle film and the electrode, the pellicle film attracted in a direction toward the electrode is adsorbed on a surface of the other element disposed between the pellicle film and the electrode, and collected.

In both cases, the pellicle film moves in a direction going away from the photomask, whereby pellicle film adsorption (i.e., contamination) on the photomask is reduced.

(Film)

In the demounting step, it is preferable to dispose a film between the pellicle film in the stack and the electrode, and demount the pellicle film by attracting the pellicle film onto a surface of the film by an electrostatic attractive force. This makes it still easier to collect the pellicle film.

The film is not particularly limited. The scope of the "film" in the present disclosure encompasses not only materials that are generally referred to as "films", but also materials that are referred to as "sheets" and materials that are referred to as "paper".

The thickness of the film is not particularly limited, and is preferably from 5 μm to 200 μm, and more preferably from 5 μm to 100 μm, from the viewpoint of durability.

The material of the film may be, for example, at least one selected from the group consisting of a resin, rubber, paper, metallic glass, and ceramics.

In a film that includes a resin as a main component (hereinafter also referred to as a "resin film"), preferable examples of the resin include polyethylene, polypropylene (PP), and polyesters (for example, polyethylene terephthalate (PET), polyethylene naphthalate (PEN), poly carbonate (PC), and the like).

The resin film may include one of the foregoing materials, or two or more of the foregoing materials. Here, the film that includes a resin as a main component refers to a film having a resin content of 50% by mass or more with respect to the entire film.

A pressure-sensitive adhesive layer may be provided on one face the film or on both faces of the film. Specifically, in the demounting step, a pressure-sensitive adhesive layer-attached film may be disposed between the pellicle film of the stack and the electrode such that the pellicle film and the pressure-sensitive adhesive layer face each other, and the pellicle film may be attracted onto and adsorbed on the surface of the pressure-sensitive adhesive layer of the pressure-sensitive adhesive layer-attached film, whereby the pellicle film is demounted. This configuration makes it still easier to collect the pellicle film.

The pressure-sensitive adhesive layer-attached film is preferably a pressure-sensitive adhesive layer-attached resin film.

The pressure-sensitive adhesive layer in the pressure-sensitive adhesive layer-attached film (preferably a pressure-sensitive adhesive layer-attached resin film; the same applies hereinafter) preferably includes a pressure-sensitive adhesive. Preferable pressure-sensitive adhesives will be described later.

The thickness of the pressure-sensitive adhesive layer in the pressure-sensitive adhesive layer-attached film is not particularly limited, and is preferably in the range of approximately from 50 μm to 200 μm, from the viewpoint of collecting the pellicle film.

The method used for preparing a pressure-sensitive adhesive layer-attached film is not particularly limited, and known preparation methods may be used.

Examples of methods of preparing a pressure-sensitive adhesive layer-attached film include:
a method including applying a pressure-sensitive adhesive solution for forming a pressure-sensitive adhesive layer to at least one face of a film to form a pressure-sensitive adhesive layer, followed by drying; and
a method including applying a pressure-sensitive adhesive solution for forming a pressure-sensitive adhesive layer onto a release liner and transferring the pressure-sensitive adhesive layer to a film.

The release liner is not particularly limited as long as the release liner can easily be released from the pressure-sensitive adhesive layer. For example, a resin film (for example, a polyester film such as PET) having a surface that has been subjected to a release treatment, such as a release treatment using a fluorine-containing compound or the like, may be used.

(Heat Treatment During Demounting Step)

When the stack further includes a mask adhesion layer between the photomask and the pellicle frame, and this stack (i.e., a stack including a photomask, a mask adhesion layer, a pellicle frame, and a pellicle film that are arranged in this order) is designated as a first stack, the demounting step may include:
demounting the pellicle film by an electrostatic attractive force while leaving the pellicle frame at the photomask-side part of the first stack having the pressure-sensitive adhesive layer formed thereon, to obtain a second stack that includes the photomask, the mask adhesion layer, and the pellicle frame;
heat-treating the second stack; and
demounting the pellicle frame from the photomask in the second stack.

In the present aspect, the adhesion power exerted by the mask adhesion layer can be reduced by heat-treating the second stack, and, therefore, the demounting of the pellicle frame can more easily be carried out.

In the heat treatment, the entire second stack may be heat-treated, or a part of the second stack (for example, a part including the mask adhesion layer) may be heat-treated. The apparatus used for the heat treatment is not particularly limited, and a heater, a hot plate, an oven, or the like may be used.

The temperature of the heat treatment is, for example, from 50° C. to 140° C. The duration of the heat treatment is, for example, 10 seconds to 300 seconds <Step of Heat-Treating Stack>

The pellicle demounting method according to the present disclosure may further include a step of heat-treating the stack (i.e., a stack including a photomask, a pellicle frame, and a pellicle film) before the demounting step.

The aspect including the step of heat-treating the stack is particularly effective in a case in which the stack includes at least one of the pellicle film adhesion layer or the mask adhesion layer. In this case, heat-treating the stack can decrease the adhesion power exerted by at least one of the pellicle film adhesion layer or the mask adhesion layer, as a result of which demounting can more easily be carried out while reducing breakage of the pellicle film.

In the heat treatment, the entire stack may be heat-treated, or a part of the stack (for example, a part including at least one of the pellicle film adhesion layer or the mask adhesion layer) may be heat-treated.

The apparatus used for the heat treatment is not particularly limited, and a heater, a hot plate, an oven, or the like may be used. The temperature of the heat treatment is, for example, from 50° C. to 140° C. The duration of the heat treatment is, for example, from 10 seconds to 300 seconds.

<Step of Forming Pressure-Sensitive Adhesive Layer>

The step of forming a pressure-sensitive adhesive layer is a step of forming a pressure-sensitive adhesive layer on the pellicle film in the stack described above. The step of forming a pressure-sensitive adhesive layer is preferably a step of forming a pressure-sensitive adhesive layer using a spray coating method, a spin coating method, an inkjet method, a screen printing method, or a dip coating method, more preferably a step of forming a pressure-sensitive adhesive layer using a spray coating method or a spin coating method, and particularly preferably a step of forming a pressure-sensitive adhesive layer using a spray coating method, from the viewpoint of further reducing the load applied to the pellicle film during the forming of a pressure-sensitive adhesive layer.

Forming a pressure-sensitive adhesive layer using a spray coating method may be performed using a known spray coating apparatus. Examples of the spray coating apparatus include spray guns, ultrasonic spray coating apparatuses, two-fluid spray coating apparatuses, one-fluid spray coating apparatuses, and the like.

The pressure-sensitive adhesive layer preferably includes at least one pressure-sensitive adhesive. From the viewpoint of the capability to reduce photomask contamination, the pressure-sensitive adhesive layer preferably includes at least one pressure-sensitive adhesive selected from the group consisting of a silicone-based pressure-sensitive adhesive, an acrylic pressure-sensitive adhesive, a urethane-based pressure-sensitive adhesive, a polyamide-based pressure-sensitive adhesive, a polyester-based pressure-sensitive adhesive, an ethylene-vinyl acetate copolymer, an olefin-based pressure-sensitive adhesive, a polybutadiene-based pressure-sensitive adhesive, a rubber-based pressure-sensitive adhesive, and a styrene-based pressure-sensitive adhesive, and more preferably includes at least one pressure-sensitive adhesive selected from the group consisting of an acrylic pressure-sensitive adhesive, a polybutadiene-based pressure-sensitive adhesive, a rubber-based pressure-sensitive adhesive, and a styrene-based pressure-sensitive adhesive, and still more preferably includes at least one pressure-sensitive adhesive selected from the group consisting of an acrylic pressure-sensitive adhesive, a polybutadiene-based pressure-sensitive adhesive, and a rubber-based pressure-sensitive adhesive. The pressure-sensitive adhesive may be used singly or in combination of two or more thereof.

The silicone-based pressure-sensitive adhesive is preferably a pressure-sensitive adhesive that includes a silicone resin as a main component. The silicone-based pressure-sensitive adhesive is not particularly limited, and examples thereof include addition-reaction silicone-based pressure-sensitive adhesives, peroxide-curing silicone-based pressure-sensitive adhesives, and condensation silicone-based pressure-sensitive adhesives.

Among them, addition-curing silicone-based pressure-sensitive adhesives, having a high holding power, are preferable from the viewpoint of holding the pellicle film by the pressure-sensitive adhesive.

In the present disclosure, the main component of the pressure-sensitive adhesive means a component that accounts for at least 50% by mass of the total mass of the pressure-sensitive adhesive.

The acrylic pressure-sensitive adhesive is preferably a pressure-sensitive adhesive that includes an acrylic resin as a main component. The acrylic resin contained in the acrylic pressure-sensitive adhesive is not particularly limited, and examples thereof include alkyl (meth)acrylate pressure-sensitive adhesives, urethane (meth)acrylate, and epoxy (meth)acrylate.

The acrylic pressure-sensitive adhesive may be a pressure-sensitive adhesive that includes an acrylic rubber resin as a main component. The acrylic rubber resin is, for example, a block copolymer of methyl methacrylate and butyl acrylate.

The urethane-based pressure-sensitive adhesive is preferably a pressure-sensitive adhesive that includes a polyurethane resin as a main component. The polyurethane contained in the urethane-based pressure-sensitive adhesive is not particularly limited, and examples thereof include polyester polyurethanes, poly carbonate polyurethanes, and the like.

The polyamide-based pressure-sensitive adhesive is preferably a pressure-sensitive adhesive that includes a polyamide resin as a main component. The polyamide resin contained in the polyamide-based pressure-sensitive adhesive is not particularly limited, and examples thereof include a polyamide (Amide 11) that is a ring-opening polycondensate of undecanelactam, a polyamide (Amide 12) that is a ring-opening poly condensate of lauryllactam, and the like.

The polyester-based pressure-sensitive adhesive is preferably a pressure-sensitive adhesive that includes a polyester resin as a main component. The polyester resin is not particularly limited, and examples thereof include a condensation polymerization product of a polycarboxylic acid and a polyhydric alcohol.

Specific examples of the polyester include polyethylene terephthalate, polybutylene terephthalate, and the like.

The olefin-based pressure-sensitive adhesive is preferably a pressure-sensitive adhesive that includes an olefin resin as a main component. The olefin is not particularly limited, and may be a polymer that is a homopolymer of an olefin, or a copolymer obtained by polymerizing an olefin and one or more other monomers. The olefin is preferably an olefin having 2 to 6 carbon atoms, and examples thereof include ethylene, propylene, butene, methylpentene, and hexene. Examples of the other monomers for use in the copolymer include vinyl acetate.

The rubber-based pressure-sensitive adhesive is preferably a pressure-sensitive adhesive that includes rubber as a main component, and examples thereof include natural rubber-based pressure-sensitive adhesives and synthetic rubber-based pressure-sensitive adhesives as favorable examples. Examples of the synthetic rubber-based pressure-sensitive adhesives include styrene-butadiene copolymers (SBR, SBS), styrene-isoprene copolymers (SIS), acrylonitrile-butadiene copolymers (NBR), chloroprene copolymers, isobutylene-isoprene copolymers (butyl rubber), and the like.

Among them, from the viewpoints of ease of forming of a pressure-sensitive adhesive layer and ease of holding the pellicle film, the rubber-based pressure-sensitive adhesive is preferably a synthetic rubber-based pressure-sensitive adhesive, and more preferably a pressure-sensitive adhesive that includes a styrene-butadiene copolymer as a main component.

The polybutadiene-based pressure-sensitive adhesive is preferably a pressure-sensitive adhesive that is other than the rubber-based pressure-sensitive adhesive described above, and that includes a polybutadiene as a main component. The polybutadiene is not particularly limited as long as the polybutadiene includes a structural unit formed from butadiene, and the polybutadiene may be a homopolymer or a copolymer with one or more other monomers than butadiene.

The styrene-based pressure-sensitive adhesive is a pressure-sensitive adhesive that is other than the rubber-based pressure-sensitive adhesive described above, and that includes a polystyrene resin as a main component. The polystyrene resin is not particularly limited, and examples thereof include a homopolymer of a styrene-based monomer (such as styrene, methylstyrene, ethylstyrene, isopropylstyrene, dimethylstyrene, paramethylstyrene, chlorostyrene, bromostyrene, vinyltoluene, or vinylxylene), and a copolymer of a styrene-based monomer and one or more monomers that can copolymerize with the styrene-based monomer.

Examples of the monomers that can copolymerize with the styrene-based monomer include a vinyl monomer (such as acrylonitrile, methacrylonitrile, acrylic acid, methacrylic acid, methyl methacrylate, maleic anhydride, or butadiene).

From the viewpoint of the capability to reduce photomask contamination, the glass transition temperature of the pressure-sensitive adhesive is preferably from −60° C. to −20° C., and more preferably from −60° C. to −40° C.

From the viewpoint of the capability to reduce photomask contamination, the weight average molecular weight of the base polymer of the pressure-sensitive adhesive is preferably from 10,000 to 1,500,000, and more preferably from 50,000 to 1,000,000. It is also workable to mix base polymers having different weight average molecular weights.

The amount of the pressure-sensitive adhesive applied when the pressure-sensitive adhesive layer is formed by applying the pressure-sensitive adhesive onto the pellicle film (for example, the coating amount in the case of coating the pressure-sensitive adhesive using a spray coating method) is preferably from 1 g/m² to 500 mg/m², and more preferably from 5 mg/m² to 200 g/m², in terms of application amount after drying.

The pressure-sensitive adhesive layer may be formed by applying, onto the pellicle film, a pressure-sensitive adhesive solution containing a pressure-sensitive adhesive and a solvent. Known solvents may be used as the solvent in the pressure-sensitive adhesive solution.

Examples of the solvent in the pressure-sensitive adhesive solution include acetone, methyl ethyl ketone (2-butanone), cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetylacetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 1-methoxy-2-propanol, 3-methoxy-1-propanol, methoxymethoxyethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimethylformamide, dimethylsulfoxide, γ-butyrolactone, methyl lactate, ethyl lactate, and the like.

In the pressure-sensitive adhesive solution, only one solvent may be present, or two or more solvents may be present.

The solid concentration of the pressure-sensitive adhesive solution (i.e., the content of the pressure-sensitive adhesive with respect to the total amount of the pressure-sensitive adhesive solution) is preferably approximately from 1% by mass to 50% by mass.

The viscosity (at 25° C.) of the pressure-sensitive adhesive solution is preferably from 1 mPa·s to 1,000 mPa·s, and more preferably from 100 mPa·s to 800 mPa·s, from the viewpoint of further improving the tightness of the adhesion between the pellicle film and the pressure-sensitive adhesive.

The viscosity of the pressure-sensitive adhesive solution can be adjusted, as appropriate, based the type and/or amount of the solvent.

The thickness of the pressure-sensitive adhesive layer is more preferably from 1 μm to 1 mm, and still more preferably from 50 μm to 1 mm. The thickness of the pressure-sensitive adhesive layer can be adjusted using known methods.

For example, in a case in which the pressure-sensitive adhesive layer is formed using a spray coating method, the thickness of the pressure-sensitive adhesive layer can be adjusted by adjusting the discharge amount of the pressure-sensitive adhesive solution discharged from a spray coating apparatus (such as a spray gun).

The thickness of the pressure-sensitive adhesive layer can be obtained by cutting the stack in the vertical direction and observing the resultant cross-section using a scanning electron microscope.

The pressure-sensitive adhesive layer may have lattice-structured grooves. For example, when the protective film described below is overlaid on the pressure-sensitive adhesive layer, the lattice-structured grooves provided on the pressure-sensitive adhesive layer prevents rupture of the pellicle film by facilitating discharge of the air, which has been trapped between the pellicle film and the protective film at the time of adhering together the pellicle film and the protective film, to the exterior space via the lattice structure.

The apparatus for carrying out the step of forming a pressure-sensitive adhesive layer (for example, the pellicle demounting device described below) may include a cover for preventing the pressure-sensitive adhesive discharged toward the self-standing portion of the pellicle film from being deposited on a portion of the pellicle film other than the self-standing portion and a portion other than the pellicle film.

<Step of Adhering Protective Film in Pressure-Sensitive Manner>

The pellicle demounting method according to the aforementioned aspect that includes a step of forming a pressure-sensitive adhesive layer may further include a step of adhering, in a pressure-sensitive manner, a protective film onto the pressure-sensitive adhesive layer in the stack having the pressure-sensitive adhesive layer formed thereon, after the step of forming the pressure-sensitive adhesive layer but before the demounting step.

The protective film is not particularly limited, and favorable examples thereof include a polyethylene terephthalate (PET) film, a polypropylene (PP) film, and a poly carbonate (PC) film.

The thickness of the protective film is not particularly limited. From the viewpoint of providing an adequate strength, the thickness of the protective film is preferably from 50 μm to 500 μm, and more preferably from 100 μm to 200 μm.

The protective film may be layered, in the form of a co-extruded dual layer film of the protective film and the pressure-sensitive adhesive layer, on the pellicle film.

The pellicle demounting method according to the present disclosure may include steps other than the steps described above, if necessary.

Embodiment 1, which is a specific embodiment of the pellicle demounting method according to the present disclosure, is described below. However, the pellicle demounting method according to the present disclosure is not limited to the following embodiment.

Embodiment 1

Embodiment 1 is described below with reference to FIG. 6. Explanation regarding FIG. 6 is as described above.

In Embodiment 1, a stack having the same configuration as that of the stack shown in FIG. 6, and an electrostatic chuck (not shown) as an electrode-including unit are disposed in an orientation such that the pellicle film 602 in the stack and the electrode in the electrostatic chuck face other. At this time, the stack is disposed in a vertically inverted orientation (i.e., in an orientation such that the pellicle film 602 is located at the lower side and the photomask 605 is located at the upper side) compared to the orientation shown in FIG. 6. The electrostatic chuck is disposed below the pellicle film 602 of the stack, such that the electrode faces upward.

Then, a resin film (not shown) having a pressure-sensitive adhesive layer thereon is disposed between the pellicle film 602 of the stack and the electrode of the electrostatic chuck, such that the pellicle film 602 and the pressure-sensitive adhesive layer (not shown) face each other with a predetermined spacing therebetween.

In this state, a voltage is applied to the electrode of the electrostatic chuck, to generate an electrostatic attractive force, and the pellicle film 602 is attracted in a direction toward the electrode (i.e., downward) due to the generated electrostatic attractive force, whereby the pellicle film 602 is demounted from the photomask 605 of the stack.

The pellicle film 602 thus demounted is collected by being adsorbed on the pressure-sensitive adhesive layer of the pressure-sensitive adhesive layer-attached resin film. The collecting of the pellicle film 602 may be performed by a process in which the pellicle film 602 is broken, and in which pellicle film pieces generated by the breakage are adsorbed on the pressure-sensitive adhesive layer. During the demounting, the interior of the stack may be made to have a positive pressure by feeding air to the interior of the stack through a through hole (i.e., an air vent; not shown) penetrating from the outer peripheral face of the pellicle frame 603 to the inner peripheral face of the pellicle frame 603, and the pellicle film may be broken by expanding the pellicle film 602 toward the outer side (i.e., in a direction toward the electrode).

After the pellicle film 602 is demounted, the residual second stack (i.e., a stack that includes the photomask 605, the mask adhesion layer 607, the pellicle frame 603, and the pellicle film adhesion layer 606) is placed on a hot plate in an orientation such that the photomask 605 and the hot plate contact each other, and the second stack was heated to achieve a temperature of the mask adhesion layer of about 50° C., whereby the adhesion power of the mask adhesion layer 607 is reduced.

Subsequently, the mask adhesion layer 607, the pellicle frame 603, and the pellicle film adhesion layer 606 are demounted from the photomask 605 by inserting a grip tool for pellicle frame handling into a recess portion and/or a cutout (not shown) provided at the outer peripheral face of the pellicle frame 603 in the second stack, or allowing the grip tool to catch the pellicle frame 603 at the recess portion and/or cutout.

[Pellicle Remounting Device]

Next, an embodiment of a pellicle demounting device that is suitable for implementing the foregoing pellicle demounting method according to the present disclosure will be described.

The pellicle demounting device according to the present embodiment is a pellicle demounting device for implementing the demounting step of the pellicle demounting method according to the present disclosure, and includes:
  a retainer member configured to retain the stack described in the description of the pellicle demounting method according to the present disclosure; and
  the electrode described in the description of the pellicle demounting method according to the present disclosure.

The pellicle demounting method according to the present disclosure can be carried out using the pellicle demounting device according to the present embodiment. Thus, according to the pellicle demounting device according to the present embodiment, an effect with respect to reduction of photomask contamination caused by pellicle film pieces is exerted, as with the pellicle demounting method according to the present disclosure.

The retainer member in the pellicle demounting device according to the present embodiment is a member that retains the stack described in the description of the pellicle demounting method according to the present disclosure (i.e., a stack that includes a photomask, a pellicle frame, and a pellicle film that are arranged in this order).

The electrode in the pellicle demounting device according to the present embodiment is the electrode described in the description of the pellicle demounting method according to the present disclosure (i.e., an electrode configured to generate an electrostatic attractive force when a voltage is applied, and to demount the pellicle film from the photomask in the stack by attracting the pellicle film based on the generated electrostatic attractive force).

The pellicle demounting device according to the present embodiment may include an electrostatic chuck as an electrode-including unit, as described above. This configuration enables the pellicle film to be demounted using an electrode in the electrostatic chuck.

It is preferable that the retainer member in the present embodiment retains the stack in an orientation to locate the photomask at the upper side and locate the pellicle film at the lower side, and has an opening through which at least the self standing portion of the pellicle film is exposed.

According to the present aspect, the demounted pellicle film and/or pellicle film pieces fall downward (i.e., in the gravitational direction) through the opening, whereby photomask contamination due to attachment of pellicle film pieces is more effectively reduced.

Figure 9:
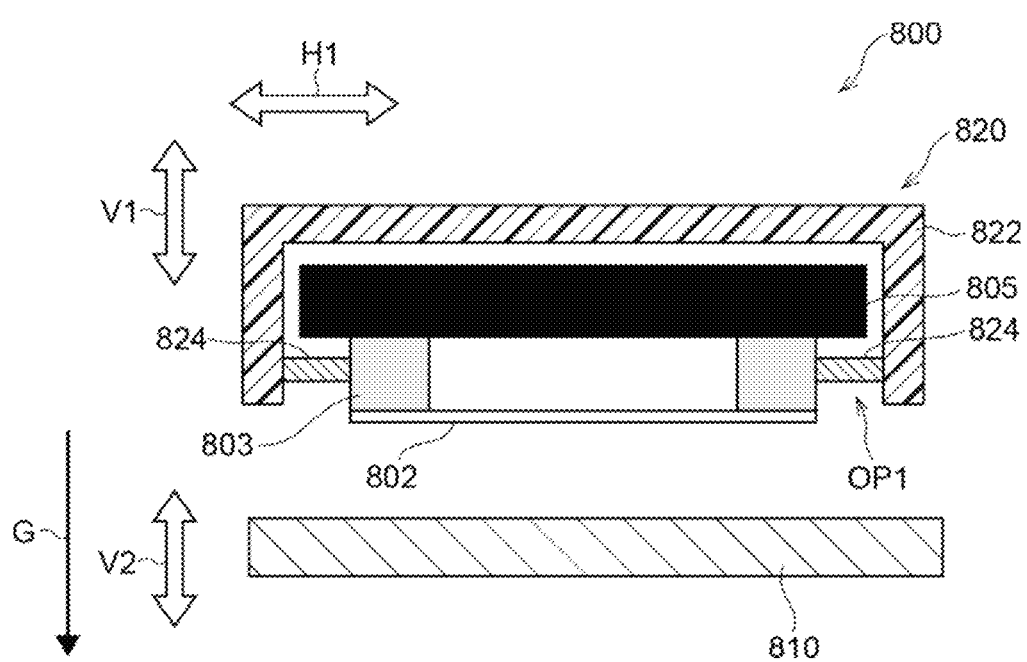
FIG. 9 is a schematic cross-sectional view schematically illustrating one example of a pellicle demounting device according to an embodiment of the present disclosure.
Figure 10:
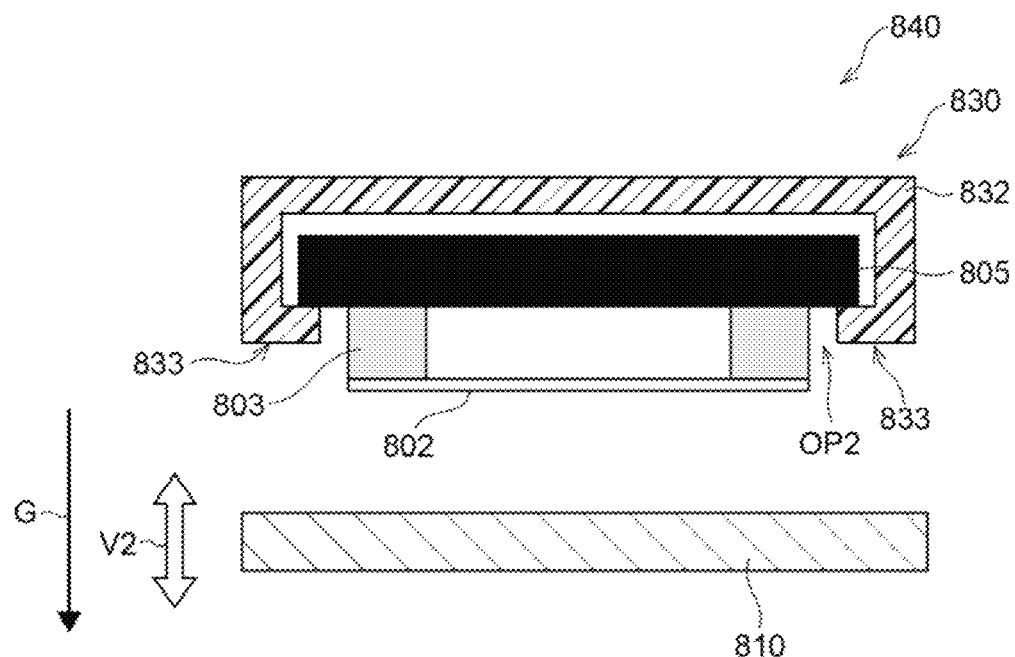
FIG. 10 is a schematic cross-sectional view schematically illustrating another example of a pellicle demounting device according to an embodiment of the present disclosure.

The scope of the opening through which at least the self-standing portion of the pellicle film is exposed includes:
  an aspect in which the opening is disposed at the lower side of the pellicle film; as well as
  an aspect in which the opening is disposed at the upper side of the pellicle film (i.e., an aspect in which the pellicle film hangs downwardly through the opening) (see, for example, FIGS. 9 and 10).

When the retainer member in the present aspect retains the stack, it is preferable that the retainer member retains the stack by supporting at least one of the pellicle frame or the photomask in the stack (see, for example. FIGS. 9 and 10), from the viewpoint of reducing unintended damage to the pellicle film occurring at the time of, for example, attachment to the retainer member.

In aspects in which the retainer member has the opening, it is preferable that (1) the retainer member and the electrode are arranged such that the opening in the retainer member and the electrode face each other, or that (2) at least one of the retainer member or the electrode is movable to attain an arrangement in which the opening in the retainer member and the electrode face each other.

In these aspects, pellicle film demounting by an electrostatic attractive force can more easily be carried out since the electrostatic attractive force can more effectively be exerted on the pellicle film during demounting.

The aspect (1) means that the opening of the retainer member and the electrode always face each other. The aspect (1) is not limited to a case in which the retainer member and the electrode have a fixed arrangement, and also encompasses an aspect in which at least one of the retainer member or the electrode is movable to change the distance between the retainer member and the electrode.

The aspect (2) means an aspect wherein an arrangement in Which the opening of the retainer member and the electrode face each other and an arrangement in which the opening of the retainer member and the electrode do not face each other are both possible, due to at least one of the retainer member or the electrode being movable.

The aspect (2) encompasses an aspect wherein a conveyance member capable of conveying the stack while retaining the stack is used as the retainer member, and wherein the conveyance member as the retainer member is movable such that the retainer member can take both of the electrode-facing arrangement and the electrode non-facing arrangement.

In the aspect (1) or the aspect (2), the area of the electrode is preferably larger than the area of the opening. This configuration enables demounting by attracting the entire self-standing portion of the pellicle film in a direction toward the electrode, thereby more effectively reducing contamination of the photomask.

In this preferable configuration, when the pellicle has a self-standing portion having a shape of, for example, a 6 inch×6 inch square, the size of the opening is made to be a rectangle (including a square) having a size of 6 inch×6 inch or greater.

In the pellicle demounting device preferably according to the aspect (1) or (2), the pellicle demounting device preferably further includes a film transfer means that runs a resin film between the opening and the electrode, which face each other (specifically, in the case of the aspect (2), between the opening and the electrode when the opening and the electrode face each other).

In this aspect, the pellicle film and/or the pellicle film pieces are made to fall on the resin film from the opening by demounting, and the pellicle film and/or the pellicle film pieces can be collected by the running of the resin film. Due to this, pellicle film demounting can more efficiently be carried out while reducing contamination of the photomask.

As the transfer method for the resin film in the film transfer means, a two-roll method capable of transferring a film continuously, a sheet-feeding method whereby film sheets are discontinuously transferred one by one, or the like may be used. Among them, the two-roll method is preferable from the viewpoint of the efficiency of demounting.

The retainer member in the pellicle demounting device preferably includes a pellicle frame fixing member configured to fix the pellicle frame. This configuration enables reduction of positional shift of the pellicle frame during the demounting of the pellicle film.

The pellicle demounting device according to the present embodiment may include another member than the above-described members, if necessary.

Three specific examples of the pellicle demounting device according to the present embodiment are described below. However, the pellicle demounting device according to the present embodiment is not limited to the three examples described below.

FIG. 9 is a schematic cross-sectional view schematically illustrating one example of a pellicle demounting device according to the present embodiment. As illustrated in FIG. 9, a pellicle demounting device 800 according to this example includes: a retainer member 820 configured to retain a stack including a photomask 80805, a pellicle frame 803, and a pellicle film 802 that are arranged in this order; and an electrode 810 that is disposed below the retainer member 820.

The retainer member 820 includes a box-shaped housing 822 having an opening OP1, and, further, pellicle frame fixing pins 824 as a pellicle frame fixing member. By these elements, the retainer member 820 retains the stack in an orientation in which the photomask 805 is located at the upper side and in which the pellicle film 802 is located at the lower side, in a state in which the pellicle film 802 is exposed from the opening OP1. A main face and side faces of the photomask 805 on which the pellicle is not mounted are surrounded by the housing 822.

The retainer member 820 retains the stack by fixing the pellicle frame 803 of the stack by the pellicle frame fixing pins 824. One end of each pellicle frame fixing pin 824 is connected to the inner face of the housing 822. The other end of each pellicle frame fixing pin 824 fixes the pellicle frame 803. The method used for the fixing is not particularly limited, and examples thereof include a method in which the other end of the pellicle frame fixing pin 824 is inserted into a recess portion or a cutout (not shown) provided at the outer peripheral face of the pellicle frame 803, or by allowing the other end of the pellicle frame fixing pin 824 to catch the pellicle frame 803 at the recess portion or the cutout.

The retainer member 820 is movable in a horizontal direction H1. This configuration enables the pellicle demounting device 800 to take both of an arrangement in which the opening OP1 of the retainer member and the electrode 810 face each other and an arrangement in which the opening OP1 of the retainer member and the electrode 810 do not face each other.

The retainer member 820 is also movable in the vertical direction V1 (i.e., the gravitational direction G and a direction opposite to the gravitational direction G). The electrode 810 is also movable in the vertical direction V2 (i.e., the gravitational direction G and the direction opposite to the gravitational direction G).

The electrostatic attractive force exerted on the pellicle film 802 can be controlled by controlling the distance (i.e., gap) between the electrode 810 and the pellicle film 802 by these constitutional elements at the time of demounting.

The electrode 810 is connected to a power source (not shown) for applying a voltage to the electrode 810. As described above, an electrostatic chuck as an electrode-including unit may be used instead of the electrode 810 in the present example.

The area of the electrode 810 is larger than the area of the opening OP1 of the retainer member 820 (more specifically, the housing 822). This configuration enables demounting by attracting the entire self-standing portion of the pellicle film 802 in a direction toward the electrode 810, thereby more effectively reducing contamination of the photomask.

One example of the operation of the demounting device 800 (i.e., demounting of the pellicle) will be described.

First, the stack is retained on the retainer member 820, as described above. This operation may be carried out in an arrangement in which the opening OP1 of the retainer member and the electrode 810 do not face each other.

Then, the retainer member 820 is moved in the horizontal direction H1, in a manner controlled to achieve an arrangement in which the opening OP1 of the retainer member and the electrode 810 face each other. A voltage is applied from a power source (not shown) to the electrode 810 in this state, thereby generating an electrostatic attractive force. At this time, the gap between the electrode 810 and the pellicle film 802 is adjusted so as to adjust the electrostatic attractive force generated.

The electrostatic attractive force attracts the pellicle film 802 in a direction toward the electrode 810. It is acceptable for the pellicle film 802 to be broken by the electrostatic attractive force in this process. The pellicle film 802 or pellicle film pieces generated by the breakage of the pellicle film 802 are attracted to the electrode 810. The pellicle film 802 or the pellicle film pieces are thereby demounted in the direction departing from the photomask 805, whereby adsorption of the pellicle film (i.e., contamination) on the photomask is reduced.

In the present example, the electrode is disposed below the pellicle film 802, as a result of which the gravitational force also attracts the pellicle film 802 or the pellicle film pieces to the electrode 810. Thus, contamination of the photomask is more strongly reduced.

In the present example, the pellicle frame 803 is fixed by the pellicle frame fixing pins 824, as a result of which positional shift of the pellicle frame 803 is reduced at the time of demounting the pellicle film 802.

The pellicle film 802 is demounted from the photomask 805 of the stack, in the above-described manner. Thereafter, the pellicle frame 803 is demounted from the photomask 805, if necessary, using conventional methods.

FIG. 10 is a schematic cross-sectional view schematically illustrating another example of the pellicle demounting device according the present embodiment. The configuration of the pellicle demounting device shown in FIG. 10 is the same as the configuration of the pellicle demounting device 800 shown in FIG. 8, except that the structure of the retainer member for retaining the stack is different. Thus, the pellicle demounting device 840 exerts an effect that is similar to that exerted by the pellicle demounting device 800.

A retainer member 830 in the pellicle demounting device 840 includes a housing 832, but does not include pellicle frame fixing pins. The housing 832 also has a box shape having an opening OP2, as with the housing 833 (FIG. 8), but differs from the housing 833 (FIG. 8) in that the housing 832 has a protruding portion 833 that defines the opening OP2.

The retainer member 830 in the pellicle demounting device 840 retains the stack by supporting the photomask 805 by the protruding portion 833.

Also in the pellicle demounting device 840, the area of the electrode 810 is larger than the area of the opening OP2 of the retainer member 830 (more specifically, of the housing 832).

Figure 11:
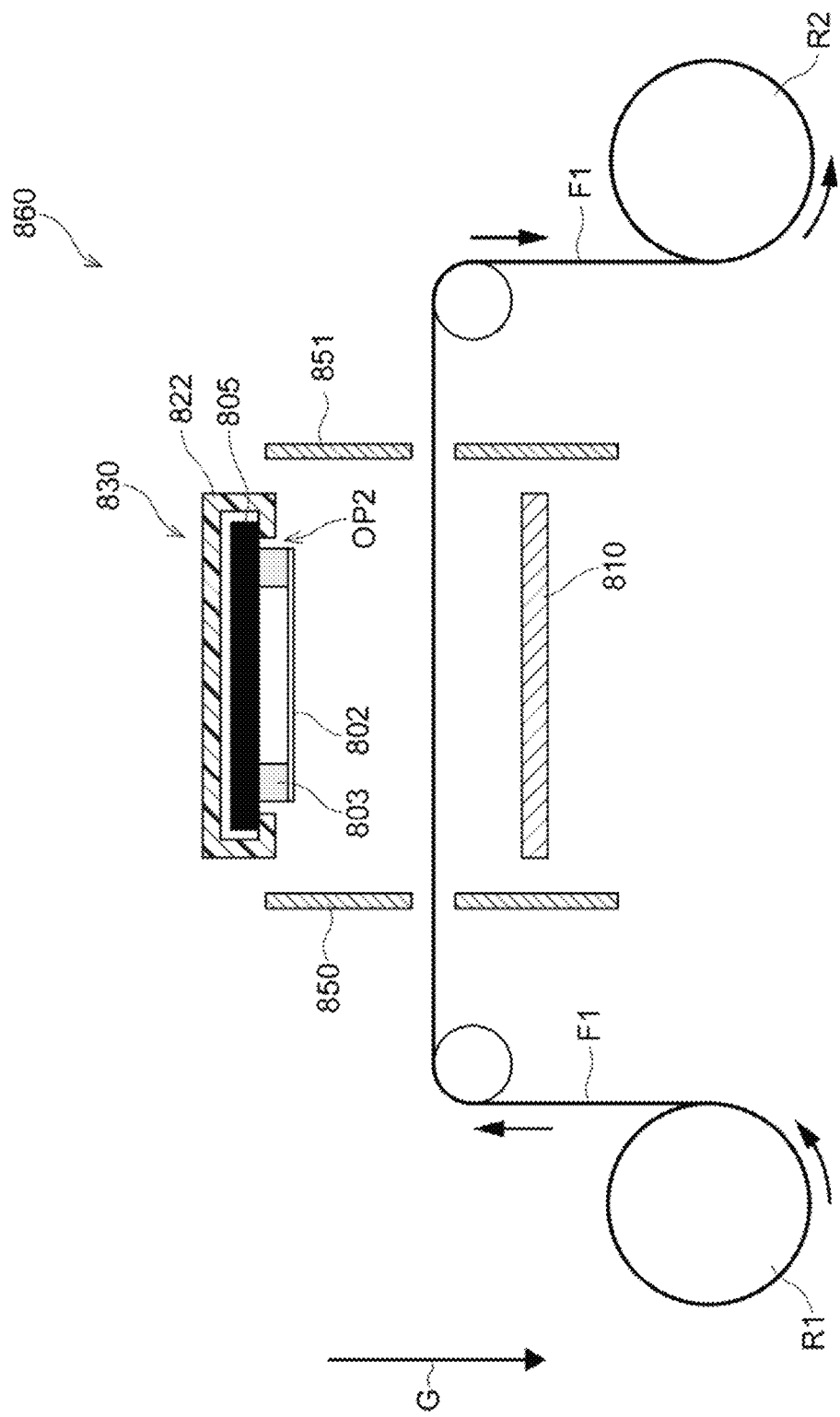
FIG. 11 is a schematic cross-sectional view schematically illustrating still another example of a pellicle demounting device according to an embodiment of the present disclosure.

FIG. 11 is a schematic cross-sectional view schematically illustrating another example of the pellicle demounting device according to the present embodiment. The configuration of the pellicle demounting device 860 shown in FIG. 11 is the same as the configuration of the pellicle demounting device 840 shown in FIG. 8, except for the following points. Thus, the pellicle demounting device 860 exerts an effect that is similar to that exerted by the pellicle demounting devices 800 and 840.

The pellicle demounting device 860 shown in FIG. 11 further includes, between the opening OP2 and the electrode 810 facing each other, a film transfer means for running a resin film F1 (specifically, a film feeding apparatus R1 and a film winding apparatus R2 for transferring a film in a two-roll transfer manner). The pellicle film demounted from the photomask is thereby collected on the resin film F1. Thus, demounting of the pellicle film can more efficiently be performed while reducing contamination of the photomask.

A pressure-sensitive adhesive layer may be formed at a side of the resin film F1 at which the resin film F1 faces the opening OP2. This makes it still easier to collect the pellicle film.

The pellicle demounting device 860 includes a partitioning member 850 disposed at the upstream side of the retainer member 830 and the electrode 810 in the resin film transfer direction. The partitioning member 850 has an opening for passing a resin film therethrough.

The pellicle demounting device 860 includes a partitioning member 851 disposed at the downstream side of the retainer member 830 and the electrode 810 in the resin film transfer direction. The partitioning member 851 also has an opening for passing a resin film therethrough.

In the pellicle demounting device 860, a demounting region is defined as a region between the partitioning members 850 and 851. Scattering of the pellicle film to the outside of the demounting region can be reduced by performing demounting of the pellicle film in the demounting region. Further, scattering of the pellicle film to the outside of the demounting region can more strongly be reduced by adjusting the air pressure in the demounting region to be lower than the air pressure outside the demounting region.

EXAMPLES

The present invention is specifically described below by reference to examples. However, the present disclosure is not limited to these examples.

Example 1

Demounting of a pellicle was performed by carrying out the following steps. Specifics thereof are described below.
<Step of Providing Stack>
A pellicle was provided which included:
a SiN pellicle film;
a pellicle frame that supports the SiN pellicle film at one end face side of the pellicle frame;
a pellicle film adhesion layer that is disposed between the SiN pellicle film and the pellicle frame; and
a mask adhesion layer that is provided on an end face of the pellicle frame at the opposite side from the end face that supports the SiN pellicle film.

Handling holes that are recess portions are provided on the outer peripheral face of the pellicle film. The handling holes serve as a point of load for demounting with a lever. Through holes for air vent that penetrate from the outer peripheral face to the inner peripheral face are also provided in the pellicle frame.

The pellicle was pressed against the light shielding film layer side of a photomask that includes the light shielding film layer, at a load of 98 N for 30 seconds in an orientation in which the light shielding film layer side of the photomask and the mask adhesion layer of the pellicle contact each other. The pellicle was thereby mounted on the photomask, to obtain a stack.
<Step of Providing Electrode>
An electrostatic chuck (more specifically, a 8-inch electrostatic chuck manufactured by NGK Spark Plug Co., Ltd.) was prepared as an electrode-including unit.
<Demounting Step>
The stack was fixed, in a suspended state, to a suspension-type precision stage that can be driven in Z-axis (hereinafter also referred to as a "suspension-type Z-drive stage") such that the pellicle film faced downward.

The aforementioned electrostatic chuck was disposed below the suspension-fixed stack. In other words, the stack and the electrostatic chuck were arranged such that the pellicle film of the stack and the electrode of the electrostatic chuck faced each other. Here, the arrangement was adjusted such that the pellicle film face and the electrode face were parallel to each other, and such that the distance between the pellicle film face and the electrode face was 50 mm.

Thereafter, a resin film (specifically, a PET film manufactured by Toray Industries, Inc. having a thickness of 50 μm with a commercial name, LUMIRROR (registered trademark)) was disposed on the electrostatic chuck. In this state, a voltage of 800V was applied to the electrode of the electrostatic chuck for 1 minute, thereby generating an electrostatic attractive force (i.e., a horizontal holding power) of about 7 gf/cm$^2$ (i.e., 68.6 mN/cm$^2$) and causing the PET film to be adsorbed on the electrostatic chuck.

Then, the stack that was suspension-fixed to the suspension-type Z-drive stage was slowly moved downward, to allow the pellicle film of the stack to contact the PET film disposed on the electrostatic chuck. This state was maintained for 5 minutes. Thereafter, the stack was slowly moved upward, thereby breaking the pellicle film. The broken pellicle film was adsorbed, by an electrostatic attractive force, on the PET film disposed on the electrostatic chuck. In this manner, the pellicle film was demounted from the photomask.

Then, the second stack (i.e., a stack including a photomask, a mask adhesion layer, and a pellicle frame) left after the demounting of the pellicle film was placed on a hot plate in an orientation such that the photomask and the hot plate contacted each other, and the second stack was heated at about 70° C. for 5 minutes. The adhesion power of the mask adhesion layer was thereby reduced.

Subsequently, the pellicle frame of the second stack was demounted using a lever while using the handling holes provided on the outer peripheral face of the pellicle frame as points of load.

After the above-described operations, the appearance of the photomask was visually observed, and attachment of foreign matters (i.e., contamination) was not found.

The disclosure of Japanese Patent Application No. 2019-225700, filed Dec. 13, 2019, is incorporated herein by reference in its entirety.

All publications, patent applications, and technical standards mentioned in this specification are herein incorporated by reference to the same extent as if each individual publication, patent application, or technical standard was specifically and individually indicated to be incorporated by reference.

The invention claimed is:

1. A method of demounting a pellicle, the method comprising:
provsiding a stack including a photomask, a pellicle frame, and a pellicle film that are arranged in this order;
providing an electrode; and
a demounting step including disposing the stack and the electrode such that the pellicle film in the stack and the electrode face each other, and applying a voltage to the electrode to generate an electrostatic attractive force, which attracts the pellicle film in a direction toward the electrode, thereby demounting the pellicle film from the photomask in the stack.

2. The pellicle demounting method according to claim 1, wherein, in the demounting step, a film is disposed between the pellicle film in the stack and the electrode, and the pellicle film is demounted by being attracted to a surface of the film by the electrostatic attractive force.

3. The pellicle demounting method according to claim 1, wherein the stack further comprises a mask adhesion layer between the photomask and the pellicle frame.

4. The pellicle demounting method according to claim 3, wherein, when the stack is designated as a first stack, the demounting step comprises:
demounting the pellicle film by means of the electrostatic attractive force while leaving the pellicle frame at the photomask-side part of the first stack, to obtain a second stack that includes the photomask, the mask adhesion layer, and the pellicle frame;
heat-treating the second stack; and
demounting the pellicle frame from the photomask in the second stack.

5. The pellicle demounting method according to claim 1, further comprising heat-treating the stack prior to the demounting step.

6. The pellicle demounting method according to claim 1, wherein at least one of a recess portion or a cutout is provided at an outer peripheral face of the pellicle frame.

7. A pellicle demounting device for implementing the demounting step of the pellicle demounting method of claim 1, the device comprising:
a retainer member configured to retain the stack; and
the electrode.

8. The pellicle demounting device according to claim 7, wherein the retainer member is configured to retain the stack in an orientation such that the photomask is located at an upper side and the pellicle film is located at a lower side, and the retainer member has an opening configured to expose at least a self-standing portion of the pellicle film.

9. The pellicle demounting device according to claim 8, wherein the retainer member and the electrode are disposed such that the opening and the electrode face each other, or wherein at least one of the retainer member or the electrode is movable to attain an arrangement in which the opening and the electrode face each other.

10. The pellicle demounting device according to claim 9, wherein the electrode has an area that is larger than that of the opening.

11. The pellicle demounting device according to claim 9, further comprising a film transfer unit configured to run a resin film across a region between the opening and the electrode facing each other.

12. The pellicle demounting device according to claim 7, wherein the retainer member includes a pellicle frame fixing member configured to fix the pellicle frame.

* * * * *